United States Patent

Golubic et al.

[11] Patent Number: 5,990,554
[45] Date of Patent: Nov. 23, 1999

[54] SEMICONDUCTOR PACKAGE HAVING ISOLATED HEATSINK BONDING PADS

[75] Inventors: Theodore R. Golubic; Timothy L. Olson, both of Phoenix, Ariz.

[73] Assignee: Motorola, Inc., Schaumburg, Ill.

[21] Appl. No.: 08/052,857

[22] Filed: Apr. 23, 1993

Related U.S. Application Data

[63] Continuation of application No. 07/620,871, Dec. 3, 1990, abandoned.

[51] Int. Cl.⁶ .................................................. H01L 21/70
[52] U.S. Cl. .......................... 257/734; 257/675; 257/706; 257/711; 257/717
[58] Field of Search ................... 357/81, 70, 65; 361/388, 389

[56] References Cited

U.S. PATENT DOCUMENTS

| | | | |
|---|---|---|---|
| 4,107,727 | 8/1978 | Ikezawa et al. | 357/81 |
| 4,990,720 | 2/1991 | Kaufman | 357/70 |
| 4,994,897 | 2/1991 | Golubic et al. | 357/65 |

*Primary Examiner*—Carl Whitehead, Jr.
*Attorney, Agent, or Firm*—Miriam Jackson; Rennie W. Dover

[57] ABSTRACT

A heatsink having isolated bonding pads formed on the heatsink eliminates breaking of the wire bond, lifting of the wire bond to the heatsink, and die attach material contamination of the bond. In one embodiment, the isolated bonding pad has an elevated pedestal configuration. In a second embodiment, the isolated bonding pad has an elevated pedestal configuration, so that the pedestal is also configured to lock a mold compound around the pedestal. In a third embodiment, the isolated bonding pad has an island configuration. In a fourth embodiment, the island configuration is configured to lock the mold compound formed around the island. The locking mechanism of the elevated pedestal or island prevents delamination of the mold compound to heatsink interface, preventing lifting or breaking of a wire bonded to the isolated bonding pad.

3 Claims, 3 Drawing Sheets

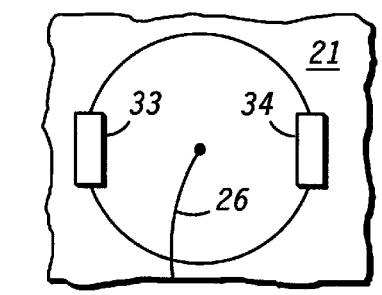
FIG. 5
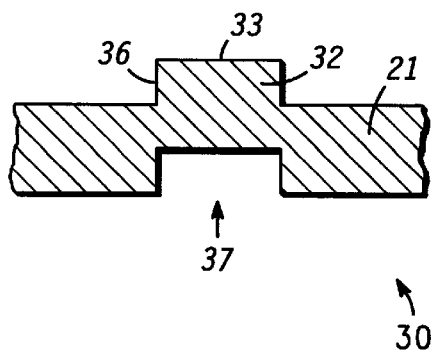
FIG. 6
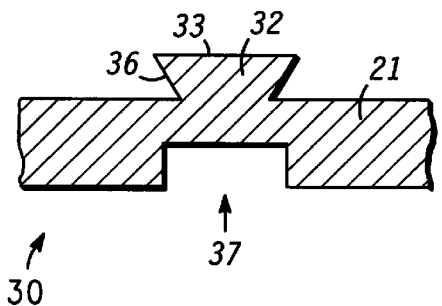
FIG. 7
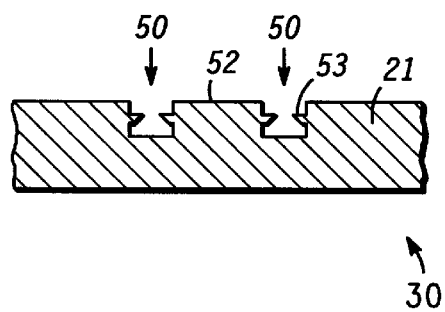
FIG. 8
FIG. 9
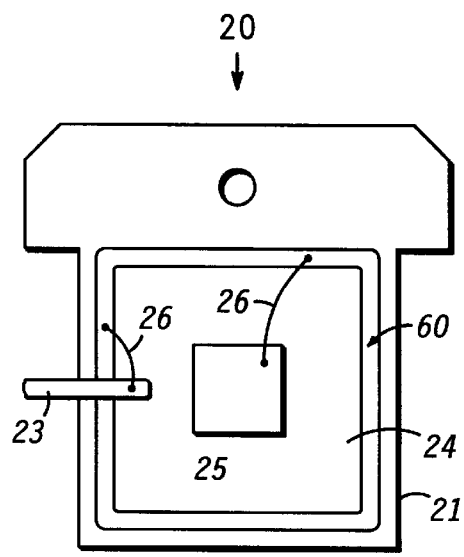

SEMICONDUCTOR PACKAGE HAVING ISOLATED HEATSINK BONDING PADS

This application is a continuation of prior application Ser. No. 07/620,871, filed Dec. 3. 1990, now abandoned.

BACKGROUND OF THE INVENTION

This invention relates, in general, to semiconductor devices, and more particularly, to a heatsink of a semiconductor package having isolated heatsink bonding pads.

Semiconductor die are housed in semiconductor packages wherein the die is bonded to the flag portion of a heatsink of a leadframe which is then encapsulated in a mold compound. With many die designs, connection means, such as metal wires, are required to electrically connect the semiconductor die to the heatsink. In addition, a connection means may also be required from a lead of the leadframe to the heatsink. The leadframe, including the leads and the heatsink, is comprised of a metal, while the mold compound is comprised of a plastic.

The connection means bonded to the heatsink are subjected to large stresses during temperature cycling, which can occur during testing or field use. The difference in the rate of expansion and contraction of metal and plastic places stress on the connection means and can cause the mold compound to delaminate from the heatsink interface. The delamination of the mold compound creates stress directly on the connection means that often causes the connection means to lift or break. This is highly disadvantageous because semiconductor device failure occurs.

A way of preventing delamination of the mold compound from the heatsink is by altering the chemical composition of the heatsink and/or mold compound to improve adhesion or otherwise minimize the differential in the expansion and contraction of the metal and the plastic of the heatsink and the mold compound. Unfortunately, a reliable metal and plastic system is not known at this time. In addition, because finding a reliable metal and plastic system may be complex, it would be desirable to come up with a simpler, yet effective, solution to the problem.

A method of providing partial isolation of the heatsink and a bonding pad area is known. This method entails forming a hole in the leadframe so that a portion of the heatsink is partially isolated from the rest of the heatsink. It would be desirable to provide for total isolation. In addition, it is very difficult to manufacture holes in the leadframe, and it may be difficult to obtain a flat surface for bonding.

Another problem can arise in the packaging of semiconductor die; when the die is bonded to the heatsink, die attach material such as solder or epoxy may run or splash onto the area of the heatsink where bonding of the connection means is to be made. The die attach material prevents making a reliable bond from the connection means to the heatsink, thus causing device failures in testing or in the field. Because the bonding process is done automatically, and no recognition technique is used, the connection means is bonded to the heatsink in the same area regardless of whether die attach material is present or not. Thus, to ensure that no die attach material has contaminated the heatsink area, the connection means must be bonded to the heatsink further away from the die. This may require either an increase in the size of the package because the heatsink area must be enlarged, or a limit on the size of the die that may be bonded in a certain size package. As is well known, increasing the size of packages is undesirable.

As can be seen, there is a need to prevent these types of connection means bond failures.

Accordingly, it is an object of the present invention to provide a semiconductor package having improved connection means bond reliability.

Another object of the present invention is to provide an improved heatsink of a semiconductor package.

A further object of the present invention is to provide an isolated bonding pad on a heatsink for bonding a connection means.

Yet another object of the present invention is to provide a heatsink having an isolated bonding pad which has a configuration that prevents delamination of a mold compound around a connection means.

Yet a further object of the present invention is to provide a heatsink which prevents die attach material contamination of a connection means to heatsink bond.

Still another object of the present invention is to provide a semiconductor package in which larger die may be housed without increasing the size of the package.

SUMMARY OF THE INVENTION

The above and other objects and advantages of the present invention are provided by a heatsink having isolated bonding pads formed therein. In one embodiment, the isolated bonding pad has an elevated pedestal configuration. The elevated pedestal does not get contaminated with die attach material during die bond, thus the connecting means from a lead or the die may be bonded to the elevated pedestal reliably. In a second embodiment, the isolated bonding pad has an elevated pedestal configuration, wherein the pedestal is also configured to lock a mold compound around the pedestal. In a third embodiment, the isolated bonding pad has an island configuration. In a fourth embodiment, the island configuration is configured to lock the mold compound formed around the island. The locking mechanism of the elevated pedestal or island prevents delamination of the mold compound to heatsink interface, thus preventing lifting or breaking of a connection means bonded to the isolated bonding pad.

BRIEF DESCRIPTION OF THE DRAWINGS

FIG. 5 illustrates a top view of a small portion of the first embodiment of the present invention;

FIGS. 6–8 illustrate cross-sectional views of a small portion of further embodiments of the present invention;

FIG. 9 illustrates a top view of a further embodiment of the present invention.

DETAILED DESCRIPTION OF THE PREFERRED EMBODIMENTS

Figure 1:
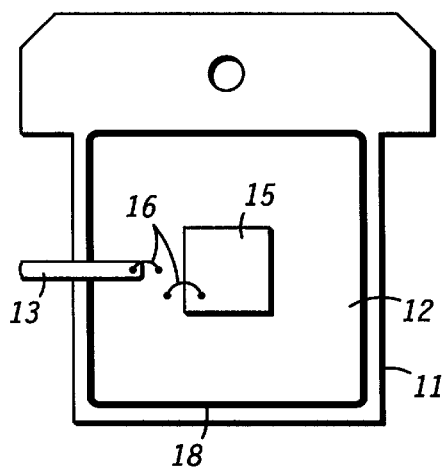
FIG. 1 illustrates a top view of a portion of a prior art leadframe.
Figure 2:
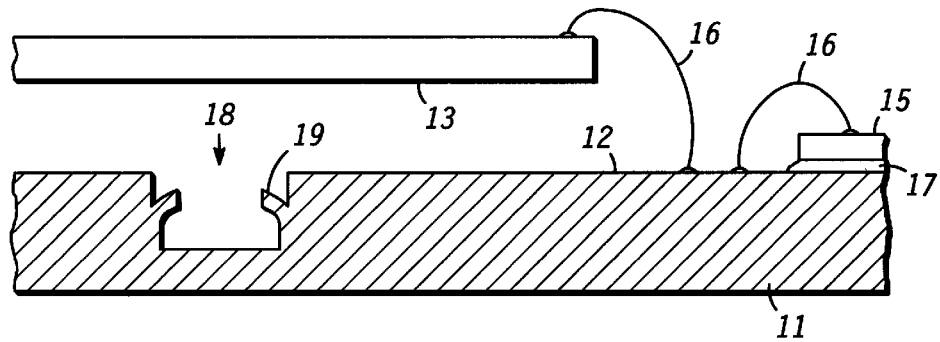
FIG. 2 illustrates a cross-sectional view of a portion of the prior art leadframe shown in FIG. 1.

FIG. 1 illustrates a top view of a prior art structure. An enlarged, cross-sectional view of a portion of leadframe 10 is shown in FIG. 2. FIGS. 1 and 2 will be discussed together. What is shown is a portion of a leadframe 10 having a heatsink 11. An area defined on heatsink 11 by a single moat 18, a flag 12, is the area on which a semiconductor die 15 is bonded to heatsink 11 with a die attach material 17 (shown only in FIG. 2). The leadframe also has leads 13 (of which only one is shown in this diagram). Typically, moat 18 has mechanical locks 19 formed therein. Locks 19 generally lock a mold compound (not shown) to all of the area of heatsink 11 to provide for overall package quality. A first connection means 16 electrically connects die 15 to heatsink 11. A second connection means 16 electrically connects lead 13 to heatsink 11. Connection means 16 are typically comprised of a gold wire. More connections from leads 13 to die 15 are typically made, but are not shown here for convenience.

As stated previously, the stress placed on connection means 16 by the delamination of the mold compound causes connection means 16 to lift or break, thus causing failures. Mechanical locks 19 present in moat 18 do not prevent the lifting or breaking of connection means 16 because delamination of the mold compound still takes place around connection means 16 because moat 19 is only effective in preventing delamination of the mold compound from heatsink 11 in the immediate area of moat 18.

Figure 3:
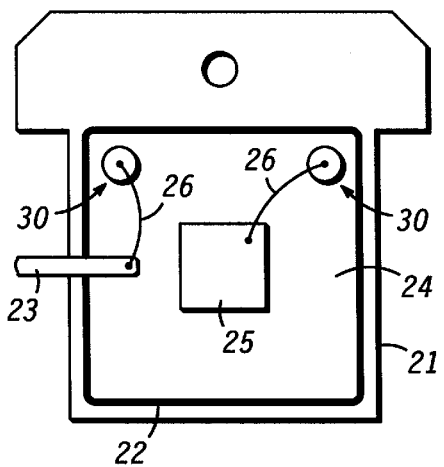
FIG. 3 illustrates a top view of a first embodiment of the present invention.

FIG. 3 illustrates a top view of a first embodiment of the present invention. What is shown is a portion of a leadframe 20 having a heatsink 21, a lead 23, and a moat 22 similar to that described with reference to FIG. 1. A die 25 is shown to be bonded to a flag 24 of heatsink 21. Connection means 26 are the same as connection means 16, also described in FIG. 1. However, in the present invention, connection means 26 are bonded to heatsink 21 on isolated bonding pads 30. The configuration of isolated bonding pad 30 will be described hereinafter with reference to FIGS. 4–8. Note that isolated bonding pads 30 may be formed where desired on heatsink 21 so that electrical connection from die 25 and lead 23 can be readily made to isolated bonding pad 30. FIG. 3 illustrates only two of various places in which isolated bonding pads 30 may be formed. At least one isolated bonding pad 30 must be provided on heatsink 21.

Figure 4:
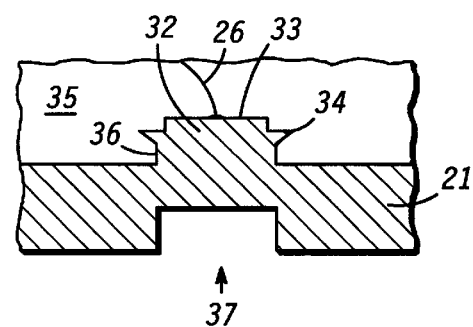
FIG. 4 illustrates a cross-sectional view of a small portion of the first embodiment of the present invention.

FIGS. 4–8 illustrate views of various configurations of isolated bonding pad 30. The same numbers will be used to describe the same or similar structures in the various configurations. FIG. 4 illustrates a cross-sectional view of a first configuration of isolated bonding pad 30. In this embodiment, isolated bonding pad 30 has an elevated pedestal configuration having sidewalls 36 and an elevated surface 33, elevated from the surface of heatsink 21, which is thus physically, but not electrically isolated from the remaining surface of heatsink 21. Elevated surface 33 is preferably generally planar for bonding connection means 26 thereto. Preferably, elevated surface 33 is formed by stamping heatsink 21, creating an indentation 37 and elevated surface 33. Other ways to form elevated surface 33 may be used that do not form an indentation 37. Mold locks 34 are protrusions extending outward from isolated bonding pad 30. Preferably, mold locks 34 are formed by stamping the edge of elevated surface 33 to cause a small portion of elevated surface 33 to protrude horizontally away from sidewalls 36.

The fact that elevated pedestal 33 of isolated bonding pad 30 is elevated from the generally planar surface of heatsink 21 provides for isolation from the rest of heatsink 21. This isolation provides for prevention of die attach material contamination between connecting means 26 and heatsink 21. Any die attach material (not shown) which spreads past die 25 is stopped by sidewalls 36 of isolated bonding pad 30. A main advantage of the present invention is the presence of mold locks 34, which prevent delamination of a mold compound 35 locally around connection means 26.

FIG. 5 illustrates a top view of the structure shown in FIG. 4. Note that the perimeter of isolated bonding pad 30 may be in the shape of a circle, a square, a rectangle, or any other shape. Mold locks 34 may be formed by stamping either a small portion at the edge of elevated surface 33 of isolated bonding pad 30 as shown in FIG. 5 or, mold locks 34 may also be formed around the whole perimeter (shown in FIG. 9) of isolated bonding pad 30. The area of isolated bonding pad 30 must be large enough and generally planar or generally horizontal to the surface of heatsink 21 to provide for reliable bonding of at least one connection means 26. For a wirebond, the dimension of elevated surface 33 of isolated bonding pad 30 is preferably a minimum of 5 times greater than the wire diameter. However, improvements in bonding techniques may allow the use of smaller pad dimensions. In certain circumstances, it may be desirable to form an isolated bonding pad 30 large enough to be able to reliably bond more than one connection means 26 thereto. In general, it is desirable to make isolated bonding pad 30 as small as possible so that the area of flag 24 shown in FIG. 3 is large. In addition, it could be possible that isolated bonding pad 30, if made too large, would not prevent the delamination of the mold compound. This exact size, however, must be determined by modeling of the stresses for different mold compounds. In general, it is necessary for isolated bonding pad to be of a fsize that provides for localized locking of the mold compound around connection means 26.

FIG. 6 illustrates a cross-sectional view of an alternate embodiment of isolated bonding pad 30 not having mold locks 34 formed therein. Isolated bonding pad 30 would provide for prevention of die attach material contamination, but would not provide for mold locking around connection means 26. Therefore, the embodiment shown in FIG. 6 is not preferred; however, if improvements in the plastic/metal system of the mold compound and the heatsink are made, isolated bonding pad 30 without mechanical locks 34 would still be advantageous.

FIG. 7 illustrates a cross-sectional view of another alternate embodiment of isolated bonding pad 30. In this embodiment, isolated bonding pad 30 does provide for mold locking because sidewalls 36 are not substantially vertical. The configuration of isolated bonding pad 30 shown in FIG. 4 is still preferred over the configuration shown in FIG. 7 because the configuration shown in FIG. 4 is more easily manufactured. Note that any configuration which prevents the vertical movement of a mold compound can be used to lock the mold compound around connection means 26.

FIG. 8 illustrates a cross-sectional view of another alternate configuration of isolated bonding pad 30. Isolated bonding pad 30, in this configuration, is provided by forming a moat 50 in heatsink 21, thus forming an isolated portion, or island 52. Mold locks 53 are formed in moat 50 to provide for locking of a mold compound. This configuration also provides for prevention of die attach material contamination; any die attach material will run off into moat 50. The locking of a mold compound will still be provided if moat 50 is not substantially filled by the die attach material. As one can readily see, the elevated, isolated bonding pad configuration of FIG. 4 is more preferable than the island configuration of FIG. 8 from the standpoint of optimum mold locking and prevention of die attach material contamination. Island 52 may also be elevated (not shown).

FIG. 9 illustrates a top view of a further embodiment of the present invention. The same reference numerals will be used to refer to the same elements as in FIG. 3. In FIG. 9, an isolated bonding pad 60 is formed around the perimeter of heatsink 21. Isolated bonding pad 60 can be configured as shown in FIGS. 4, or 6–8. Note that a separate moat 18 as shown in FIG. 1 is no longer necessary. The advantage of this configuration is that connection means 26 may be bonded anywhere along isolated bonding pad 60, which places no limitations on die design. Isolated bonding pad 60 must be wide enough to provide for reliable bonding of connection means thereto, but must be narrow enough to provide for localized locking of a mold compound around connection means 26.

Figure 10:
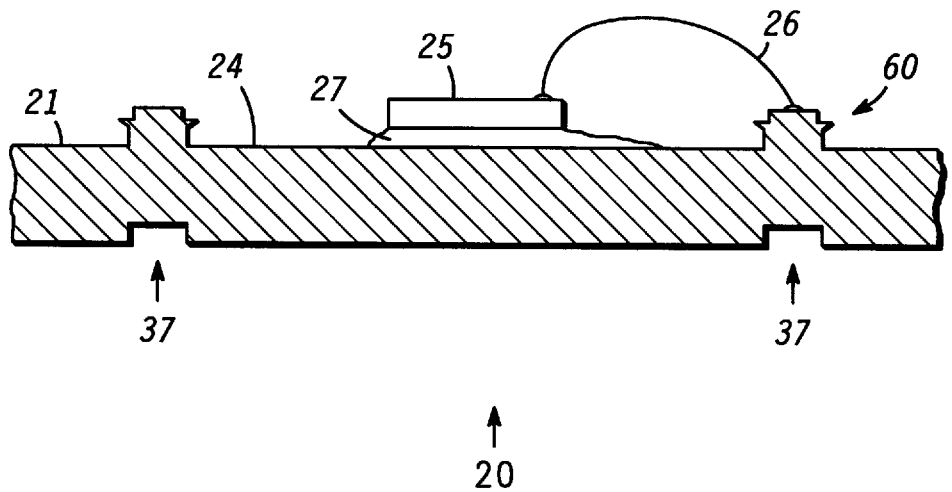
FIGS. 10 and 11 illustrate cross-sectional views of various configurations of a portion of the embodiment shown in FIG. 9.
Figure 11:
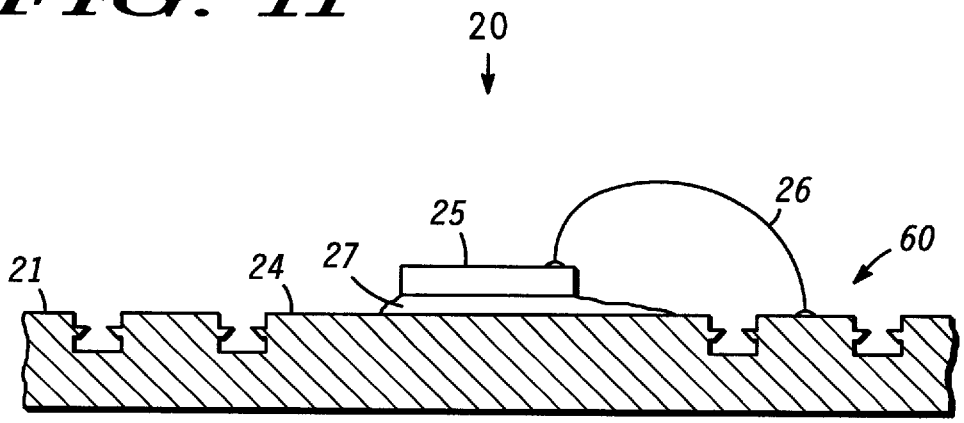

FIGS. 10 and 11 illustrate cross-sectional views of various configurations of FIG. 9. The same reference numerals are used to describe the same structures as shown in FIG. 9. Die 25 is shown to be bonded to flag 24 with a die attach material 27. FIG. 10 illustrates the case where isolated bonding pad 60 is an elevated pedestal, as shown in FIG. 4. FIG. 11 illustrates the case where isolated bonding pad 60 is an island, as shown in FIG. 8.

As can be seen, an improved semiconductor package design has been provided by the present invention. Isolated bonding pads prevent the lifting or breaking of the connection means and also prevent die attach material contamination of the connection means bond to the heatsink.

We claim:

1. A semiconductor package, comprising:

a leadframe comprised of a heatsink having a generally planar top surface and a bottom surface;

at least one isolated portion formed on the generally panar top surface of the heatsink for bonding a connection means there to and wherein the isolated portion is elevated from the generally planar top surface of the heatsink and has a size and configuration adjacent the connection means to prevent movement of a mold compound perpendicular to the generally planar top surface of the heatsink locally around the connection means; and further comprising an indentation formed in the bottom planar surface below the isolated portion.

2. A semiconductor package, comprising:

a leadframe comprised of a heatsink having a generally is planar top surface and a bottom surface;

a pad formed on the heatsink for bonding a wire thereto, wherein the pad is elevated from the generally planar top surface of the heatsink and wherein the pad has a width narrow enough and a configuration adjacent the wire to prevent the movement of a mold compound perpendicular to the generally planar top surface of the leadframe locally around the wire; and further comprising an indentation formed in the bottom planar surface below the pad.

3. The semiconductor package, comprising:

a leadframe comprised of a heatsink having a generally planar top surface for bonding a semiconductor die thereto and a bottom surface;

a semiconductor die bonded to the heatsink;

an isolated bonding pad formed on the heatsink, wherein the isolated bonding pad is elevated from the generally planar top surface of the heatsink and isolated from the rest of the heatsink;

a wire bonded to at least the isolated bonding pad;

a mold compound formed around the wire, wherein the isolated bonding pad is small enough and is configured adjacent the wire to prevent the movement of the mold compound perpendicular to the generally planar top surface of the heatsink locally around the wire to prevent lifting of the wire from the isolated bonding pad; and further comprising an indentation formed in the bottom planar surface below the isolated bonding pad.

* * * * *

UNITED STATES PATENT AND TRADEMARK OFFICE
CERTIFICATE OF CORRECTION

PATENT NO. : 5,990,554  
DATED : November 23, 1999  
INVENTOR(S) : Theodore R. Golubic et al.

Page 1 of 1

It is certified that error appears in the above-identified patent and that said Letters Patent is hereby corrected as shown below:

Column 5, claim 1,  
Line 31, delete "panar" and replace with -- planar --.  
Line 33, delete "there to" and replace with -- thereto --.

Column 6, claim 3,  
Line 17, delete "The" and replace with -- A --.

Signed and Sealed this

Sixteenth Day of April, 2002

Attest:

Attesting Officer

JAMES E. ROGAN  
Director of the United States Patent and Trademark Office